United States Patent [19]

Fuderer

[11] Patent Number: 5,561,370
[45] Date of Patent: Oct. 1, 1996

[54] ARTEFACT SUPPRESSION IN GRASE MR IMAGING

[75] Inventor: Miha Fuderer, Eindhoven, Netherlands

[73] Assignee: U.S. Philips Corporation, New York, N.Y.

[21] Appl. No.: 272,404

[22] Filed: Jul. 8, 1994

[30] Foreign Application Priority Data

Jul. 9, 1993 [EP] European Pat. Off. ............. 93202023

[51] Int. Cl.$^6$ ..................................................... G01V 3/00
[52] U.S. Cl. ........................................... 324/309; 324/307
[58] Field of Search ................................. 324/300, 312, 324/314, 307, 309

[56] References Cited

U.S. PATENT DOCUMENTS

| | | | |
|---|---|---|---|
| 4,901,020 | 2/1990 | Ladebeck et al. | 324/309 |
| 5,270,653 | 12/1993 | Pauly | 324/309 |
| 5,296,808 | 3/1994 | Macovski | 324/309 |
| 5,361,028 | 11/1994 | Kanayama et al. | 324/309 |

FOREIGN PATENT DOCUMENTS 0177990  4/1986  European Pat. Off. .

OTHER PUBLICATIONS

GRASE (Gradient–and Spin Echo) MR Imaging: A New Fast Clinical Imaging Technique, D.A. Feinberg et al, Radiology, vol. 181, p. 597–602 (1991).

Gradient Echo Shifting in Fast MRI Techniques (GRASE Shifting) For Correction in Field Inhomogeneity Errors and Chemical Shift, D. Feinberg et al, Journal of Magnetic Resonance 97, p. 177–183.

Primary Examiner—Louis M. Arana
Attorney, Agent, or Firm—Jack D. Slobod

[57] ABSTRACT

In MRI data acquisition according to the GRASE (gradient and spin-echo) sequence, trajectories (562, 563) in k-space are arranged such that different coordinates ($k_x$, $k_y$) in that space have monotonic relations with parameters (t, τ) that are related to physical effects, such as magnetic field inhomogeneities, $T_2$*-effects and motion, that causes artefacts in the image. By doing so, the artefacts are reduced.

20 Claims, 10 Drawing Sheets

ARTEFACT SUPPRESSION IN GRASE MR IMAGING

BACKGROUND OF THE INVENTION

1. Field of the Invention

The invention relates to a method for magnetic resonance imaging of a body placed in a stationary and substantially homogeneous main magnetic field, the method comprising applying an excitation radio-frequency pulse (RF-pulse) for excitation of nuclear dipole moments in at least a portion of the body, followed by applying a plurality of refocusing RF-pulses separated by intervals, switching, during said intervals, a plurality of gradient magnetic fields including reversal of gradient magnetic fields, for generating a plurality of magnetic resonance signals in the excited portion, measuring signal samples of said magnetic resonance signals, and transforming said signal samples into an image.

The invention also relates to an apparatus for magnetic resonance imaging of a body placed in a stationary and substantially homogeneous main magnetic field according to such a method, the apparatus comprising means for establishing the main magnetic field, means for generating gradient magnetic fields superimposed upon the main magnetic field, means for radiating RF-pulses towards the body, control means for steering the generation of the gradient magnetic fields and the RF-pulses, and means for receiving and sampling magnetic resonance signals generated by sequences of RF-pulses and switched gradient magnetic fields, said control means being arranged for applying an excitation radio-frequency pulse (RF-pulse) for excitation of nuclear dipole moments in at least a portion of the body, followed by applying a plurality of refocusing RF-pulses separated by intervals, switching, during said intervals, a plurality of gradient magnetic fields including reversal of gradient magnetic fields, for generating a plurality of magnetic resonance signals in the excited portion, measuring signal samples of said magnetic resonance signals, and transforming said signal samples into an image.

DESCRIPTION OF RELATED ART

Such a method is known from the Article "GRASE (Gradient and Spin-Echo) MR imaging: A new fast clinical imaging technique" by D.A. Feinberg and K. Oshio, published in Radiology, Vol. 181, pages 597–602 (1991). In this technique a Carr-Purcell-Meiboom-Gill (CPMG) sequence of RF-pulses is applied in which during the occurrence of the spin-echo, a plurality of field or gradient echo signals is generated by means of gradient reversals. In between each pair of refocusing RF-pulses a signal is sampled with different phase encoding. This allows fast sampling in k-space and provides sufficient information for a complete image in short time.

A drawback of the known method is that during a measurement sequence a number of effects occur that disturb the image. These effects are, for example, inhomogeneity of the stationary magnetic field, both due to magnet design and due to the presence of the object to be imaged, spin-spin relaxation $T_2$, chemical shift, movement or (blood) flow in the object and $T_2^*$ effects caused by microscopic variations in magnetic susceptibility in the object. These effects give rise to artefacts or ghosts in a reconstructed images, i.e. features in the image occur more than once at a mutual distance of only a few pixels. These ghosts are bothersome in an image and may considerably hamper diagnosis.

SUMMARY OF THE INVENTION

It is, inter alia, an object of the invention to provide a method and an apparatus for magnetic resonance imaging according to the introductory paragraph in which the artefacts are significantly reduced and therefore less disturbing.

To this end, the invention provides a method characterised in that the gradient magnetic fields and RF-pulses are dimensioned and applied such that signal samples measured at substantially identical values of a first parameter, of which a first disturbing effect is a function, are located in k-space having substantially the same value in a first coordinate of k-space, that signal samples measured at substantially identical values of a second parameter, of which a second disturbing effect is a function, are located in k-space having substantially the same value in a second coordinate of k-space and that signal samples measured at different values of said first and second parameter are located in k-space such that said parameters increase or decrease gradually or monotonically with said first and second coordinates, respectively.

The invention is based on the insight that the physical effects causing the artefacts evolve differently as functions of different parameters during the measurement sequence. Effects that evolve as a function of one parameter can be arranged in k-space in such a way that the parameter can be considered as a substantially monotonic and continuous function of one of coordinates of k-space, say axis $k_x$, and substantially independent of the other coordinates, say axis $k_y$, and, in 3-dimensional MRI, axis $k_z$. If, simultaneously, effects that behave as a function of another parameter are located in k-space such that the other parameter is a substantially monotonic and continuous function of another coordinate, say axis $k_y$, and is independent of the first coordinate, the disturbing effects associated with the two parameters are disentangled. After reconstruction, the result is significantly less disturbing artefacts in the image.

It is remarked that from the article "Gradient echo shifting in fast MRI techniques (GRASE imaging) for correction of field inhomogeneity errors and chemical shift" by D.A. Feinberg and K. Oshio, published in J. Magn. Reson., Vol. 97, pages 177–183 (1992), it is known to suppress certain artefacts by a modification of the GRASE sequence. In the article it is described to shift the phase of the measured samples by a modification of the read gradient. The known phase shift procedure results in a more continuous location of the measured samples in k-space. However, in that known method a disentanglement of different effects in different directions in k-space does not occur.

An embodiment of the method according to the invention is further characterised in that the first parameter corresponds to the time interval t between the excitation RF-pulse and the moment at which a signal sample is measured and that the second parameter corresponds to the time interval t between the moment the sample is measured and the moment of occurrence of the refocusing spin echo. The disturbing effects caused by the finite spin-spin relaxation time constant $T_2$, behave predominantly as a function of the time t since the excitation RF-pulse. The disturbing effects from magnetic field inhomogeneities, water-fat chemical shift, $T_2^*$ effects and some kinds of motion artefacts evolve as a function of time $\tau$. The moments of occurrence of the refocusing spin echo are the times at which the excitation RF-pulse is "mirrored" by the refocusing RF-pulses. In case of three-dimensional data acquisition, the method can be implemented such that the first parameter, for example t, is a substantially monotonic function of the first coordinate, for example $k_z$, and the second parameter ($\tau$) is a substantially monotonic function of the second coordinate ($k_y$). As each magnetic resonance signal generated corresponds to a single point in the $k_z$–$k_y$ plane, which point can be chosen at will, a very good approximation of monotonic functions can be obtained.

An embodiment of the method according to the invention can be characterised in that signal samples measured at substantially identical values of a third parameter, of which a third disturbing effect is a function, are located in k-space having substantially the same value along a third coordinate of k-space and in that the third parameter is the phase error introduced by movement, for example flow of a fluid or respiratory movement. Artefacts due to movement or flow, for example blood flow, are disentangled from other disturbing effects. This third parameter can be used to be aligned in the direction of the $k_x$ or $k_y$ axis of the k-space, rather than t or $\tau$. In a three-dimensional imaging sequence, the third parameter can be aligned with the third axis ($k_z$) in k-space.

A first practical embodiment of the method according to the invention is characterised in that in between the refocusing RF-pulses a plurality of gradient field reversals is applied in a first direction for generating gradient echo signals substantially coinciding with a constant gradient field in a second direction, and in that phase encoding gradients are applied in said first direction in between the refocusing RF-pulses and said coinciding gradient field reversals and constant gradient fields, for phase encoding of the magnetic resonance signals monotonic increasing or decreasing with the time from the excitation RF-pulse. In this embodiment the signal samples taken in chronological order are distributed on a zigzag line in k-space. The "rising" portions of the zigzag line are collected during the "odd" field-echoes and the "falling" portions during the "even" echoes or vice versa. In this manner an increase in $\tau$ corresponds to an increase in one direction ($k_x$) in k-space, while the samples taken after subsequent refocusing RF-pulses are located in a band in k-space that is displaced in the other direction ($k_y$) after each refocusing RF-pulse, i.e. with increase in t.

A second practical embodiment of the method according to the invention is characterised in that in between the refocusing RF-pulses a plurality of gradient field reversals is applied in a first direction for generating gradient echo signals, in that gradient field blips substantially coinciding with the reversal moments of the gradient field reversals are applied in a second direction, and in that phase encoding gradients are applied in said first direction in between the refocusing RF-pulses and said gradient field reversals, for phase encoding of the magnetic resonance signals, monotonic increasing or decreasing with the time from the excitation RF-pulse. In this embodiment, after an excitation RF-pulse, the measured samples are located in k-space on a number of short parallel lines in one direction ($k_y$) which are mutually separated in another direction ($k_x$). This leads to a more uniform coverage of k-space, especially, if the trajectory contains a large number of parallel lines. Moreover, sampling twice in the same point of k-space due to crossing trajectories does not occur. Also in this embodiment samples taken with increasing $\tau$ or t are located in k-space increasing in one direction ($k_x$) or another direction ($k_y$), while substantially independent from the other direction ($k_y$ or $k_x$, respectively).

For better coverage of k-space, these embodiments can be further characterised in that a plurality of similar sequences, each comprising an excitation RF-pulse, a number of refocusing RF-pulses, gradient field reversals, and constant or blipped gradient fields, is applied, wherein the trajectories in k-space traversed during each sequence are displaced in a fixed direction, in parallel with one of the axes of k-space, by applying a suitable offset of the gradient fields, which offset changes between sequences. In case the gradient field in the second direction is constant, the offset should be in time. If the gradient field in the second direction comprises gradient filed blips, the offset is to be in size. By doing so, the trajectory in k-space followed during a later sequence is shifted somewhat in the $k_x$ or $k_y$ direction from the trajectory followed during the earlier sequence.

In an embodiment of the method according to the invention, applied for three-dimensional data acquisition and imaging, a more efficient application of the method is possible if only two disturbing effects are to be reduced. This embodiment is characterised in that the first coordinate in k-space is the distance to the origin in a plane perpendicular to an axis in k-space and that the second coordinate is said axis. In this case the volume in k-space is sample cylinder by cylinder, each cylinder consisting of a set of helical scanpaths.

Preferably, in this embodiment the first parameter corresponds to the time interval t between the excitation RF-pulse and the moment at which a signal sample is measured, that the second parameter corresponds to the time interval $\tau$ between the moment the sample is measured and the moment of occurrence of the refocusing spin echo, and in that gradient fields and RF-pulse are applied such that a non-linear monotonic increase of the first coordinate with the first parameter is obtained. Maximum use is made of the available gradient power, such that the frequency of the gradients used for generating a circular trajectory in k-space can be high when their amplitude is low. This is the case near the axis that is the second coordinate.

The invention also relates to an apparatus for magnetic resonance imaging of a body placed in a stationary and substantially homogeneous main magnetic field according to a method as described hereinbefore. According to the invention in such an apparatus the control means is further arranged for dimensioning and applying the gradient magnetic fields and RF-pulses such that signal samples measured at substantially identical values of a first parameter, of which a first disturbing effect is a function, are located in k-space having substantially the same value along a first coordinate of k-space, that signal samples measured at substantially identical values of a second parameter, of which a second disturbing effect is a function, are located in k-space having substantially the same value along a second coordinate of k-space and that signal samples measured at different values of said first and second parameter are located in k-space such that said parameters increase or decrease gradually or monotonically in the direction of said first and second coordinates, respectively.

These and other, more detailed, aspects of the invention will now be elucidated by way of example with reference to the accompanying drawings.

DETAILED DESCRIPTION OF THE PREFERRED EMBODIMENTS

Figure 1:
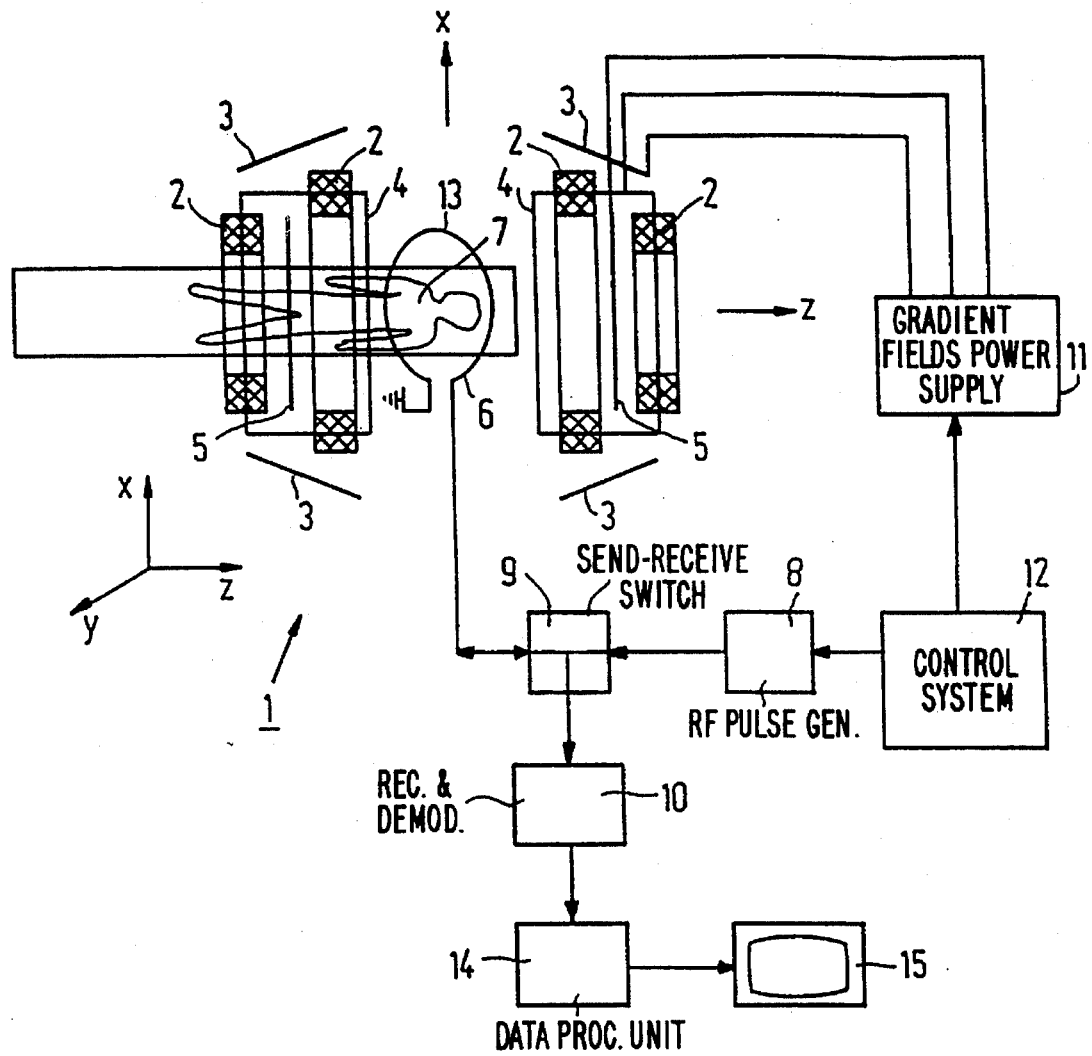
FIG. 1 diagrammatically a magnetic resonance imaging apparatus, suitable for the method according to the invention.

In FIG. 1 a magnetic resonance apparatus 1 is diagrammatically shown. The apparatus comprises a set of main magnetic coils 2 for generating a stationary and homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises an RF coil 6 for emitting radio-frequency pulses (RF-pulses) to an object or body 7, the radiation means being coupled to RF pulse generator 8 for generating and modulating RF-pulses. Also provided is an RF coil for receiving the NMR-signals, which can be RF coil 6 or a separate RF coil. If the RF coil for emitting and for receiving is the same coil, as shown in the Figure, a send-receive switch 9 is arranged to separate the received NMR signals from the RF pulses to be emitted. The received NMR-signals are input to receiver and demodulation 10. The RF pulse generator and the power supply 11 for the gradient coils 3, 4 and 5 are steered by a control system 12 to generate a predetermined sequence of RF-pulses and gradient field pulses. The receiver and demodulation 8 is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of nuclear dipole moments (nuclear spins) in the body will be aligned in the direction of the magnetic field. In equilibrium, this causes a net magnetisation $M_0$ in the material of the body 7, directed in parallel with the magnetic field. In the apparatus 1 the macroscopic magnetisation $M_0$ is manipulated by radiating to the body RF-pulses having a frequency equal to the Larmor frequency of the nuclei, thereby bringing the nuclear dipole moments in an excited state and re-orienting the magnetisation $M_0$. By applying the proper RF-pulses, a rotation of the macroscopic magnetisation is obtained, the angle of rotation is called the flip-angle. The intentional introduction of variations in the magnetic field by applying gradient magnetic fields influences the behaviour of the magnetisation locally. After the application of RF-pulses, the changed magnetisation will strive to return to a state of thermal equilibrium in the magnetic field, emitting radiation in the process. A well chosen sequence of RF-pulses and gradient field pulses causes this radiation to be emitted as NMR-signals which provide information about the density of a certain type of nuclei, for example hydrogen nuclei, and the substance in which they occur. By analysis of the emitted signals and presentation of it in the form of images, information about the internal structure of the object or body 7 is accessible. For a more detailed descriptions of magnetic resonance imaging (MRI) and MRI-devices reference is made to the extensive literature on this subject, for example to the book "Practical NMR Imaging", edited by M.A. Foster and J.M.S. Hutchison, 1987, IRL Press.

Figure 2:
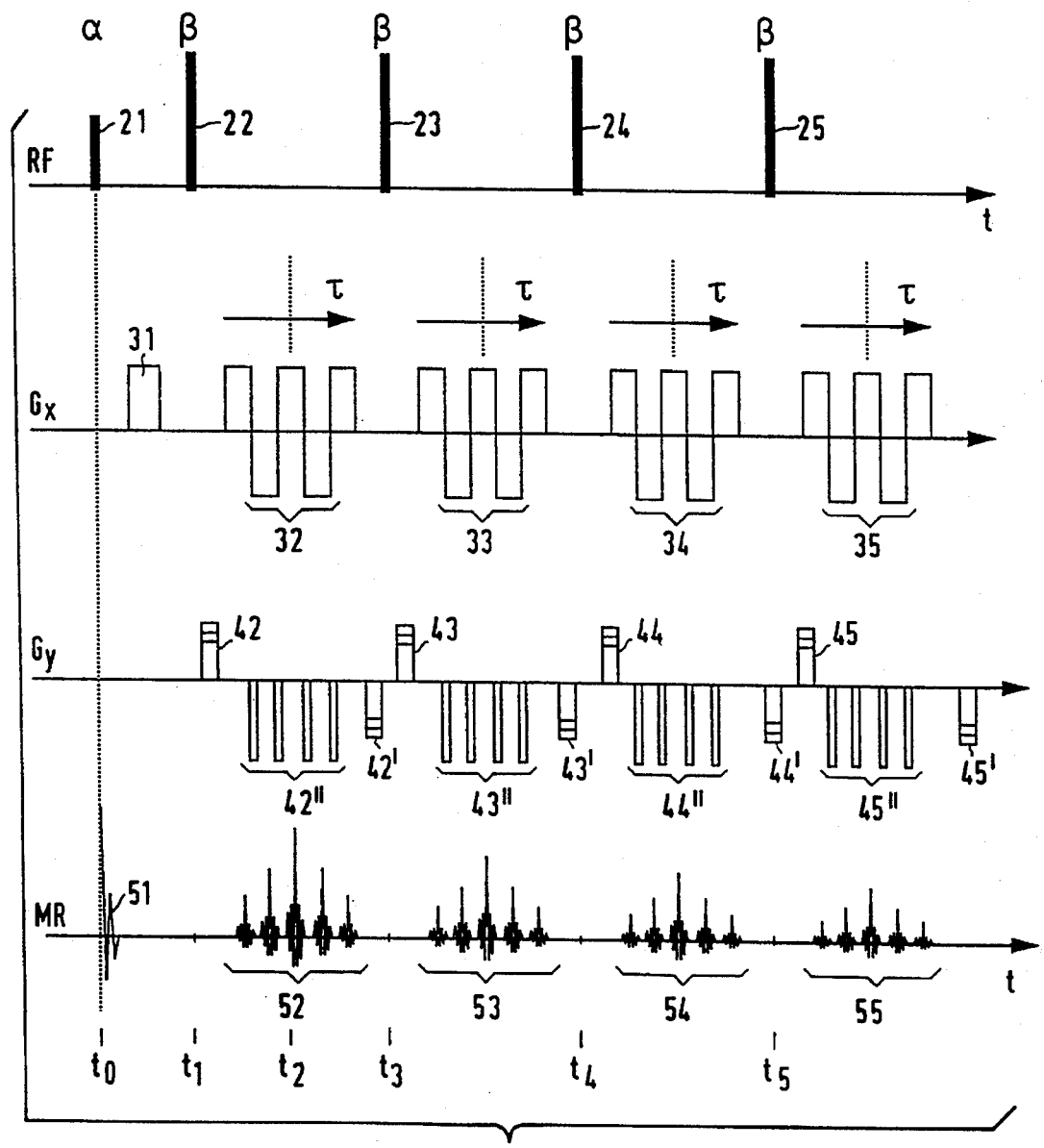
FIG. 2 a sequence of an excitation RF-pulse, a plurality of refocusing RF-pulses and reversal gradient pulses as known from the prior art.

FIG. 2 shows a known sequence of RF-pulses and magnetic field gradients according to the so-called GRASE method. The Figure shows four rows, labelled RF, indicating the occurrence of RF-pulses as a function of time, $G_x$ and $G_y$, indication the occurrence of magnetic gradient fields in first and second directions, the x- and y-directions, respectively, and MR indicating the occurrence of the magnetic resonance signals in the body caused by the RF and gradient pulses.

At time $t_0$ an excitation RF-pulse 21 is applied having a flip-angle $\alpha$, followed at time $t_1$ by a first refocusing RF-pulse 22 having a flip-angle $\beta$. The values of $\alpha$ and $\beta$ are usually chosen to be 90° and 180°, respectively. Sequences with flip-angles deviating from these values are, however, possible. Following the excitation RF-pulse 21, a free induction decay (FID) nuclear magnetic resonance signal 51, indicated in the row MR, is generated which vanishes rapidly when the individual precessing nuclear magnetic dipole moments loose phase coherence (dephase) due to local variations in the magnetic field. The refocusing RF-pulse 22 reverses the direction of these individual magnetic dipole moments without affecting the local magnetic field. Consequently, dephasing is reversed into a rephasing which, in the absence of magnetic field gradients, would result at a time $t_2$, being equal to $2 \cdot t_1$ in an NMR spin-echo signal. However, as indicated in the row $G_x$, prior to the refocusing RF-pulse 22 a magnetic field 31 with a gradient in the x-direction is applied that causes the nuclear spins to dephase. After reversal of the spins by the refocusing RF-pulse 22 a series of magnetic field gradients 32, each in reversed direction, is applied. This causes compensation of the dephasing of the spins, resulting in the occurrence of a so-called field or gradient echo and subsequence renewed dephasing. Each subsequent reversal of the gradient causes the generation of a further echo signal, resulting in a series 52 of magnetic resonance echo signals. The sequence can be repeated a number of times by repetition of refocusing RF-pulses 23, 24, 25, ... with flip-angles β, usually 180°, and subsequent trains of gradient field reversals 33, 34, 35, ... at times $t_3$, $t_4$, $t_5$, ... resulting in series of echo signals 53, 54, 55. The times $t_3$, $t_4$, $t_5$ are normally chosen such that $t_3 = 3 \cdot t_1$ and that the intervals in between the refocusing RF-pulses are of equal length ($2 \cdot t_1$).

Also following the refocusing RF-pulses 22, 23, 24, 25, respectively, phase-encoding gradient field pulses are applied with the gradient in the y-direction, as indicated in the row $G_y$. These gradients are applied in pairs 42-42', 43-43', 44-44', 45-45', ... the second pulse removing the phase-encoding. At the moments of reversal of the x-gradient fields additional spikes or blips 42", 43", 44", 45", ... in the $G_y$-gradients are applied, modifying the phase encoding values of the echo signals. As a result of the applied gradient magnetic fields the measured samples of the magnetic resonance (echo) signals are distributed over the whole of k-space on parallel lines as indicated in the centre portion of FIG. 3. Samples acquired following the first refocusing RF-pulse 22 are on the trajectory indicated with the line 62 and, in the first portion, are diagrammatically indicated by dots. Each portion in $k_x$-direction (horizontal) of the trajectory corresponds to the interval between two reversals of the read gradient 32. The portions in $k_y$-direction (vertical) are due to the spikes 42" in $G_y$. The lines 63, 64 and 65 are the trajectories traversed following the refocusing RF-pulses 23, 24 and 25, respectively. For a higher resolution additional series of measurements can be performed to cover further points in k-space. In the Figure this is indicated by the dashed lines showing similar trajectories followed in a second sequence of excitation and refocusing RF-pulses.

Figure 3:
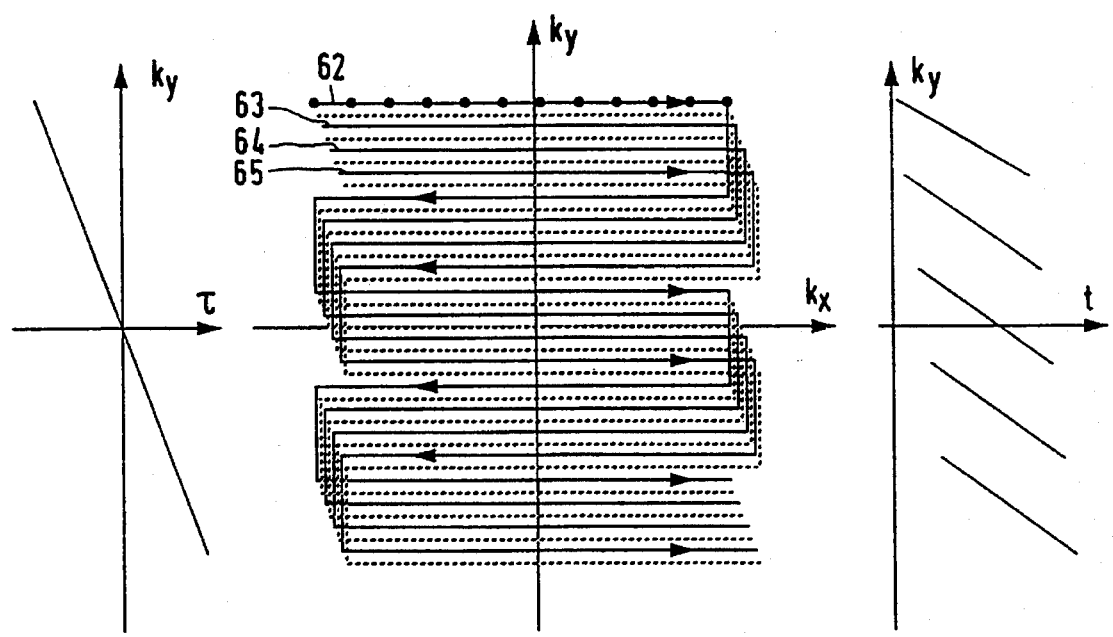
FIG. 3 diagrammatically the trajectory in k-space and the relation between disturbing effects and axes in k-space in a sequence as known from the prior art.

In the left and right hand sides of FIG. 3 the relation between $k_y$ and parameters τ and t are indicated. τ is defined as the difference in time of the moment of sampling and the moment which the excitation RF-pulse is "mirrored" by the refocusing RF-pulses, in the sequence shown in FIG. 2, this is the moment halfway two refocusing pulses. The linear function shown gives a good approximation of the qualitative relation between $k_y$ and τ, which relation is substantially linear and monotonic. In close detail, the $k_y$-τ relation is one of points distributed in stripes around the line shown. The relation between $k_y$ and t is shown on the right hand side covers a large portion of the whole rectangular area in the $k_y$-t plane. The samples taken during the first field echoes after each refocusing RF-pulse are clustered around the upper tilted line, the samples taken during the second field echo around the second tilted line etc. Evidently, the points are distributed over a large portion of the rectangular area in the $k_y$-t plane between the extreme values of these parameters. A similar distribution of points exists in the $k_x$-τ and $k_x$-t planes, covering a large fraction of rectangular area determined by the extreme values.

As a number of time dependent effects acting on the magnetic resonance signals evolve either as a function of τ or of t, the same complex relationship exists between these effects and the location in k-space. Such effects are, for example, inhomogeneity of the stationary magnetic field, spin-spin relaxation $T_2$, chemical shift, movement or (blood) flow in the object and $T_2^*$ effects. After reconstruction, this give rise to artefacts or ghosts in the reconstructed images, mainly in the form of a repeated feature in the image at a distance only a few pixels away from the image of the feature itself.

Figure 4:
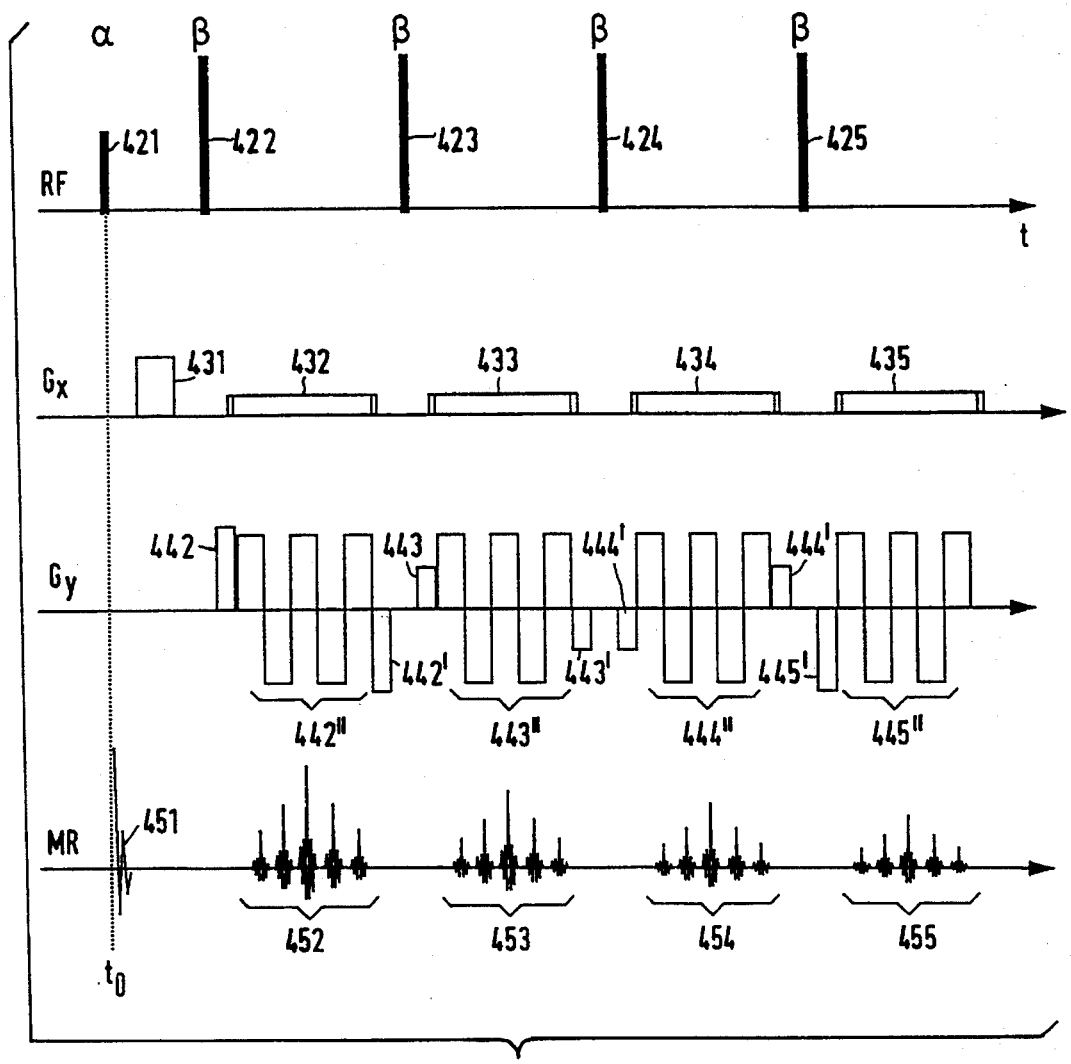
FIG. 4 a sequence of an excitation RF-pulse, a plurality of refocusing RF-pulses and reversal gradient pulses according to a first embodiment of the invention.

According to the invention these artefacts can be reduced by creating a more monotonic or continuous relationship between τ and t on the one hand and $k_x$ and $k_y$ on the other. A first embodiment in which this is achieved is shown in FIG. 4. As in FIG. 2, the upper row RF shows an excitation RF-pulse 421 and refocusing RF-pulses 422, 423, 424 and 425. The lower row MR shows the occurrence of magnetic resonance signals 452, 453, 454 and 455. In this sequence the gradient echoes are not recalled by gradient reversals coinciding in direction with the dephasing gradient 431 in between the excitation RF-pulse 421 and first refocusing RF-pulse 422, but by gradient reversals 442", 443", 444" and 445" in the same direction $G_y$ as the phase encoding gradients 442-442', 443-443', 444-444', and 445. In the first $G_x$ direction constant gradient magnetic fields 432, 433, 434 and 435 are applied simultaneously with the occurrence of the gradient reversals in $G_y$.

Figure 5:
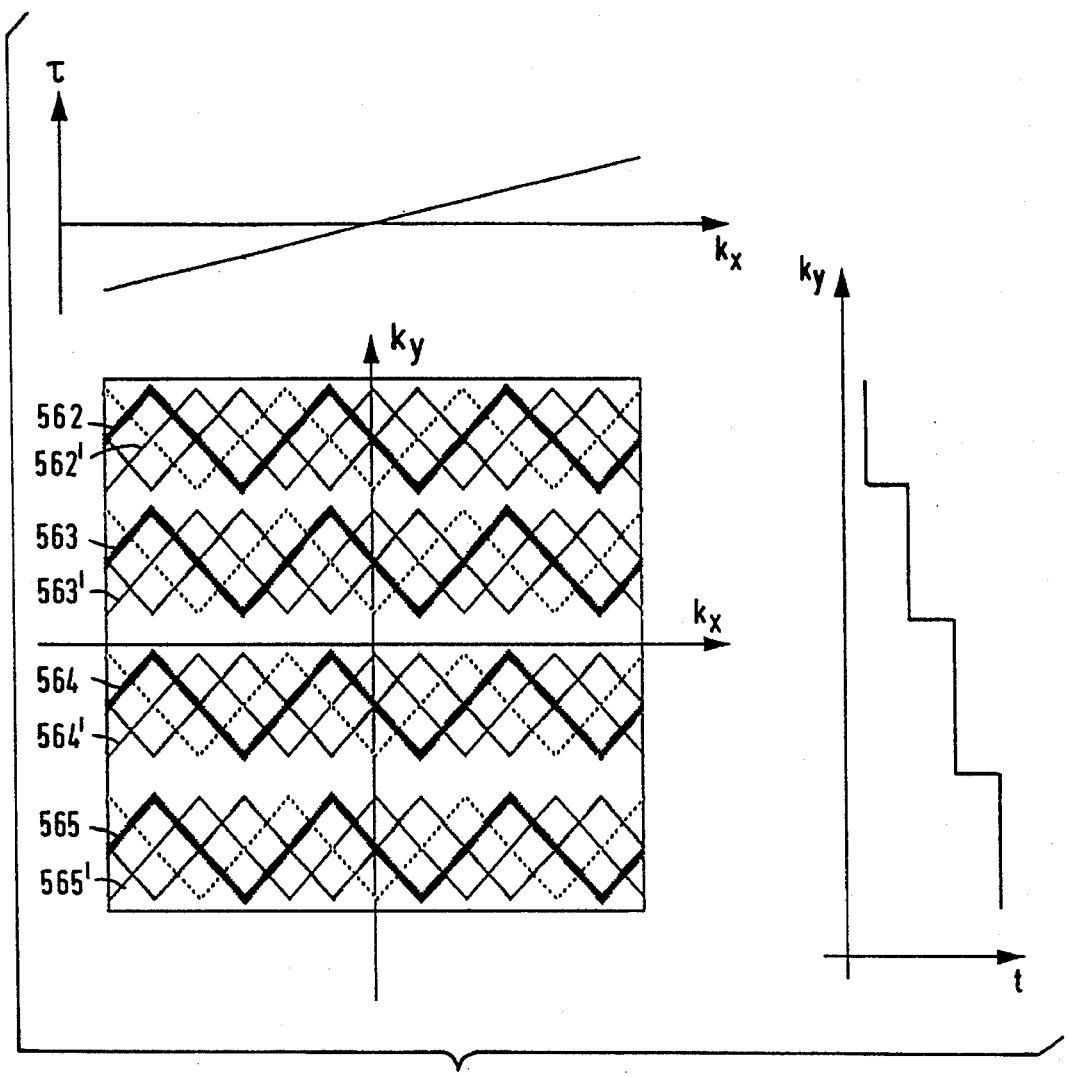
FIG. 5 diagrammatically a few trajectories in k-space and the relation between disturbing effects and axes in k-space according to the first embodiment of the invention.

As indicated in FIG. 5 the trajectory in k-space taken during data acquisition forms zigzag lines 562, 563, 564 and 565. Each of the zigzag lines corresponds to the time interval between two refocusing RF-pulses and covers the whole width of k-space in $k_x$ direction but only a limited band in $k_y$ direction. The way the sizes of the phase-encoding gradients 442, 443, 444, and 445 are ordered ensures that the sample points are distributed in the $k_y$-t plane in a band with a limited width with a substantially monotonic relation between $k_y$ and time t. The constant value of the $G_x$ gradient field creates a linear relationship between the time parameter τ and $k_x$. Each band in which $k_y$ is swept as a function of time, covers only a limited region in the $k_y$ direction, this results in that $k_y$ is substantially independent of τ. After subsequent excitation RF-pulses the same band in k-space can be sampled in an identical way. By applying a suitable offset in time of the constant $G_x$ gradient field 432, i.e. starting it somewhat earlier or later, the zigzag line in the k-space is shifted in the direction of positive or negative $k_x$. This allows sampling of intermediate locations in k-space as indicated by the lines 562', 563', 564' and 565'.

Better coverage of k-space can also be obtained by sampling intermediate locations on trajectories which are shifted in $k_y$-direction. For such shift an offset to the phase encoding gradients is to be applied.

Figure 6:
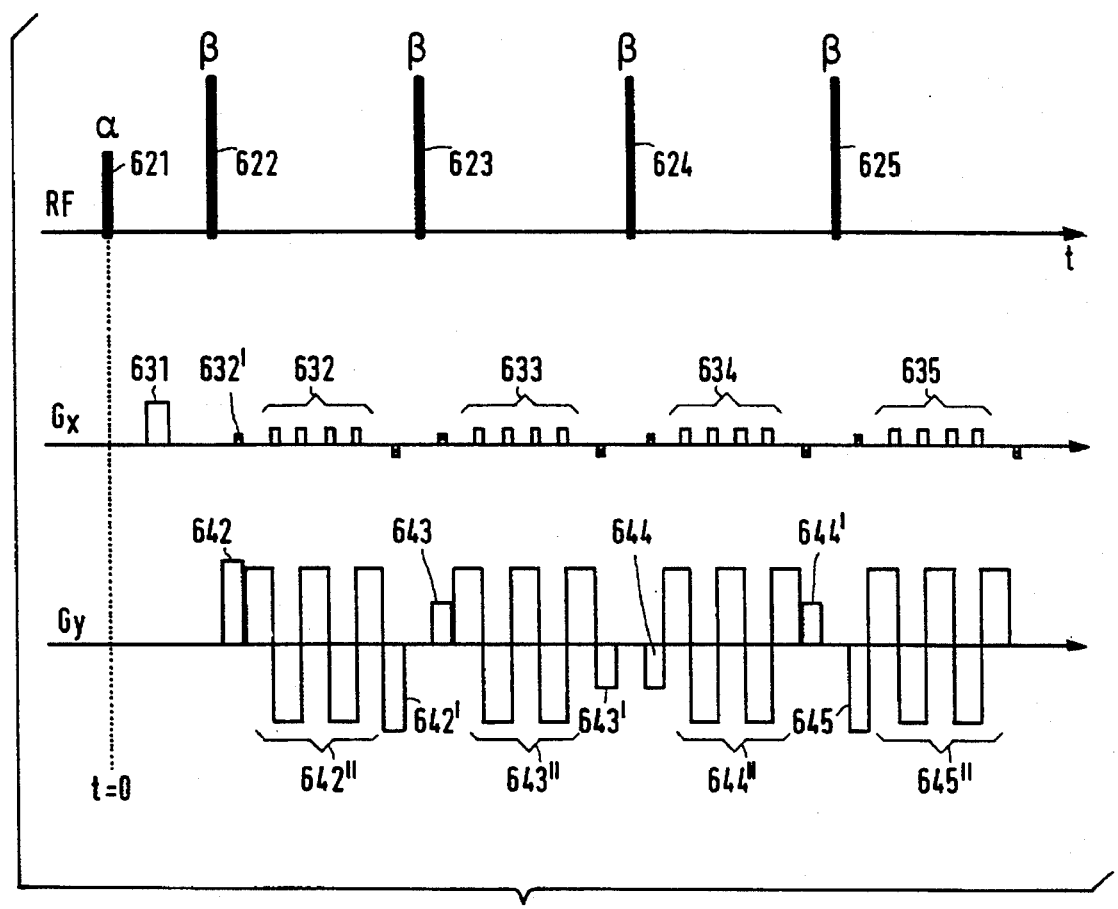
FIG. 6 a sequence of an excitation RF-pulse, a plurality of refocusing RF-pulses and reversal gradient pulses according to a second embodiment of the invention.
Figure 7:
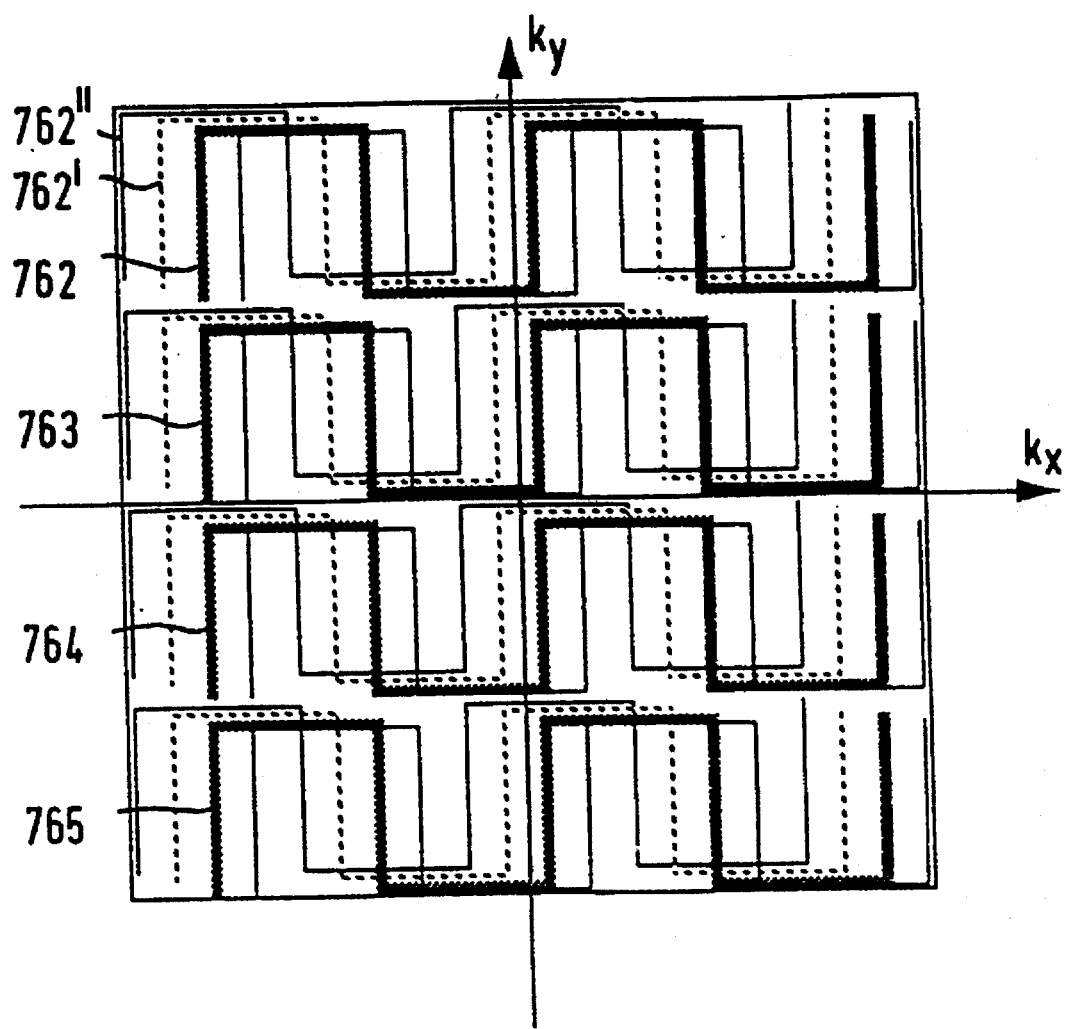
FIG. 7 diagrammatically a few trajectories in k-space and the relation between disturbing effects and axes in k-space according to the second embodiment of the invention.

In FIGS. 6 and 7 a second embodiment of the method according to the invention is illustrated. As in FIGS. 2 and 4, a sequence of excitation RF-pulse 621 and refocusing RF-pulses 622, 623, 624 and 625 is shown in the upper row RF. The gradient field $G_y$ is switched on and off in the same way as in the first embodiment, illustrated in FIG. 4, and consists of phase encoding and annihilating gradient pulses 642-642', 643-643', 644-644' and 645. Following the phase encoding gradients series of gradient reversals 642", 643", 644" and 645" are shown. In contradistinction to the first embodiment, the gradient field $G_x$ is not on continuously during the occurrence of the gradient reversed but in small blips 632, 633, 634, and 635 which coincide with the reversal of the $G_y$ gradient.

Due to this configuration of gradient pulses the trajectory traversed in k-space during data acquisition is as shown in FIG. 7. Data samples are located on short lines in parallel to the $k_y$ axis and covering only a small section of the $k_y$ range. Because of the blips, the lines are separated by a jump in the $k_x$ direction. As in the first embodiment, $k_y$ is substantially independent of τ and has a substantially linear relationship with t. The relation between $k_x$ and τ is no longer continuous, but due to the large number of generated echoes in between two refocusing RF-pulses the obtained dependency is still very satisfactory. The lines 762' and 762" indicate the trajectories that can be obtained after repeated sequences following a new excitation RF-pulse, in order to increase the number of data in k-space. These additional trajectories are shifted in $k_x$ direction by gradient pulses 632' in the $G_x$ direction, preceding the first generated magnetic resonance signal. As in the case of phase encoding gradients, these additional gradient pulses are compensated for by negative gradient pulses in between the data acquisition and the occurrence of the next refocusing RF-pulse.

An even better monotonic relation between coordinates in k-space and the parameters t and τ can be obtained in case of three-dimensional data acquisition. Then the method can be implemented such that one parameter, for example t, is a substantially monotonic function of a coordinate $k_z$ that is perpendicular to the read direction $k_x$, and the other parameter, for example τ, is a substantially monotonic function of the coordinate $k_y$ perpendicular to both read direction and first coordinate. As the samples taken during each magnetic resonance signal generated are located on a line in the read direction, the correspond to a single point in the $k_z$-$k_y$ plane, which point can be chosen at will by a suitable choice of $G_y$ and $G_z$ gradients.

Figure 8:
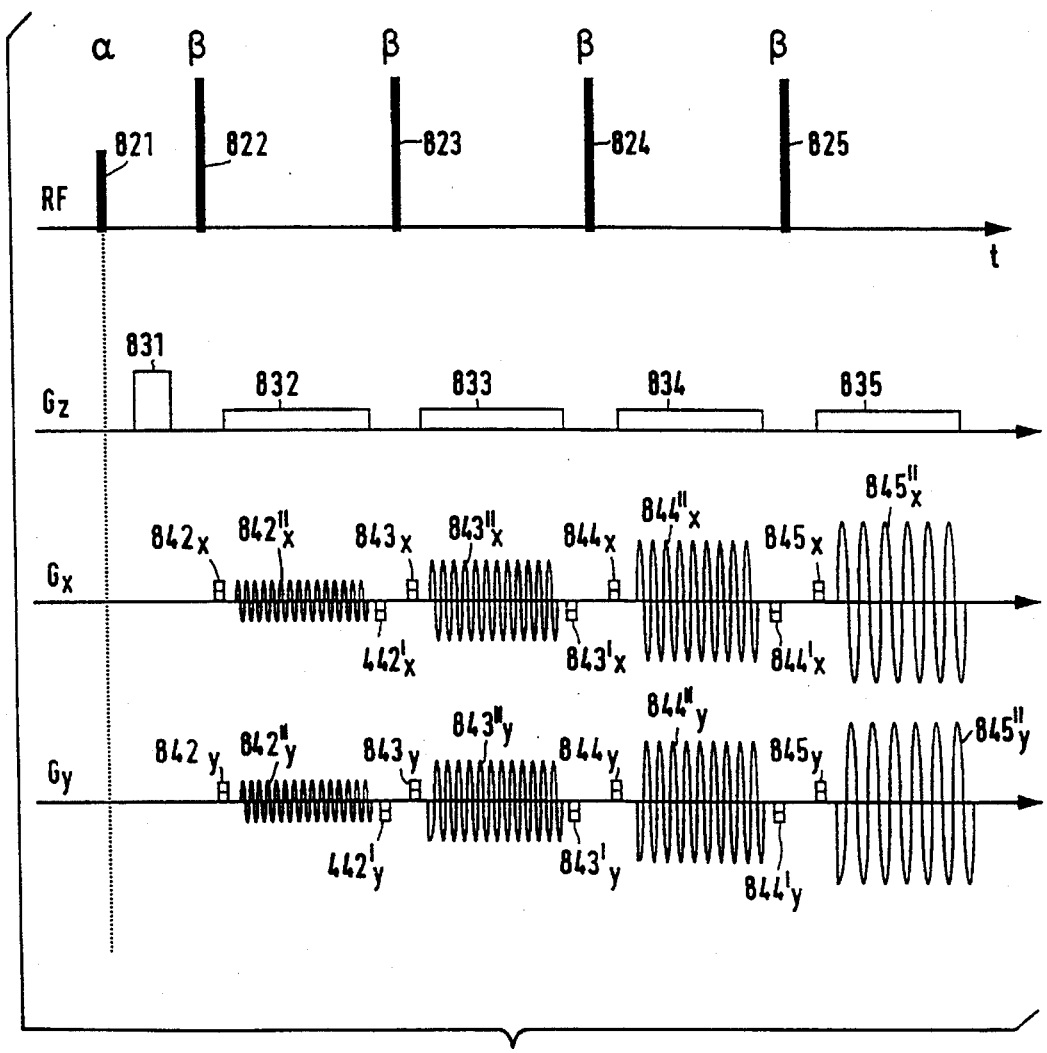
FIG. 8 a sequence of an excitation RF-pulse, refocusing RF-pulses, and gradient pulses according to an embodiment of the invention for three-dimensional cylindrical scanning.
Figure 9:
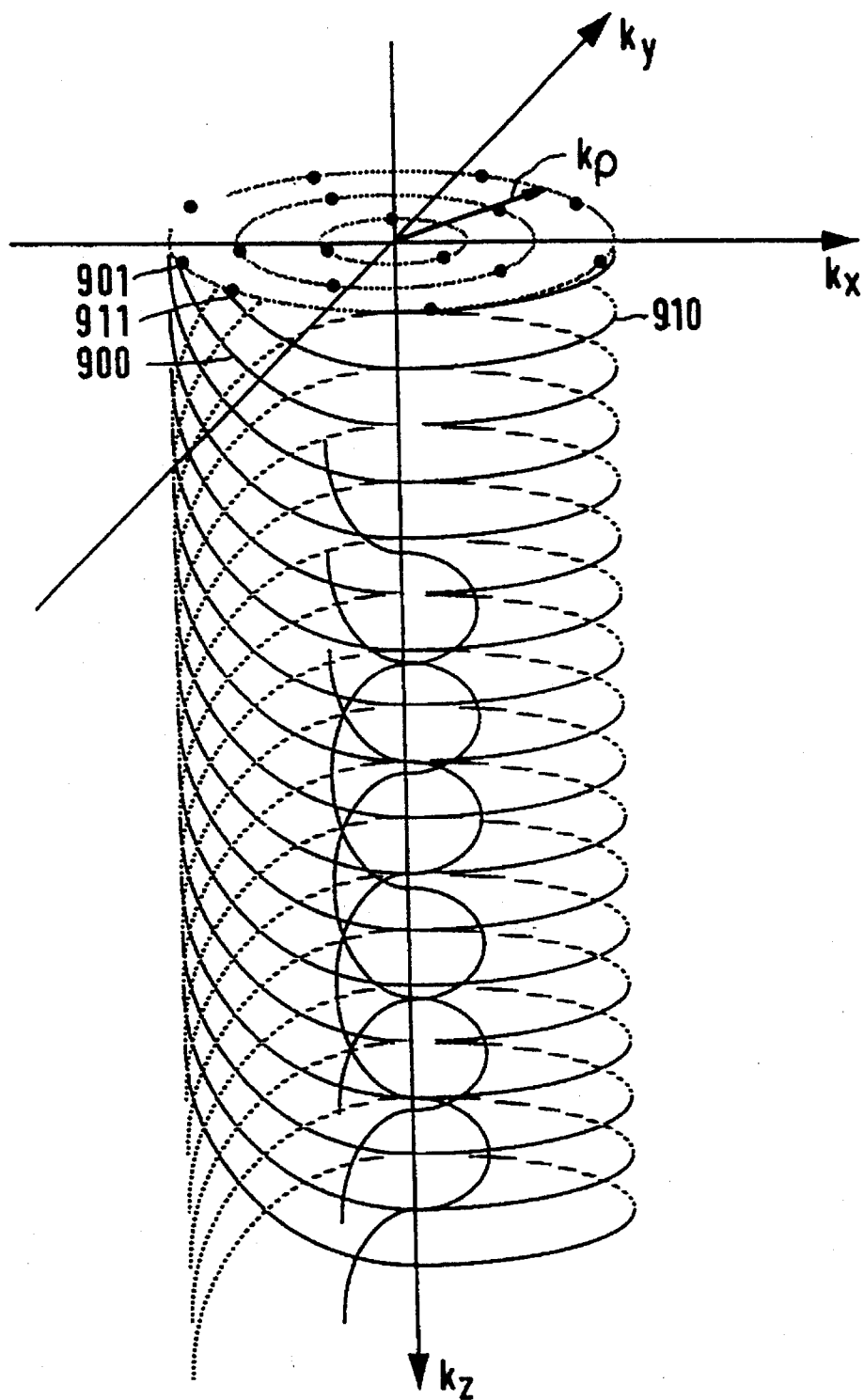
FIG. 9 diagrammatically the helical trajectory in three-dimensional k-space traversed by three-dimensional cylindrical scanning.

In FIG. 8 the RF-pulses and magnetic gradient fields are shown for a three-dimensional helical scan of k-space. Indicated are an excitation and several refocusing RF-pulses 821, 822, 823, 824 and 825 in the upper row RF. Similarly with the embodiment shown in FIG. 4, a dephasing gradient magnetic field 831 is applied in the interval between the excitation 821 and first refocusing RF-pulse 822 and constant magnetic gradient fields are applied in the intervals in between the refocusing RF-pulses 822, 823, 824 and 825. In the illustrated embodiment the direction in which these gradients are applied is labelled with $G_z$. Perpendicular to the $G_z$ direction a gradient field is applied which is rotating in time by oscillating sine-shaped $G_x$ and $G_y$ gradient magnetic fields $842''_x$-$842''_y$, $843''_x$-$843''_y$, $844''_x$-$844''_y$, and $845''_x$-$845''_y$, the x and y components having a phase difference of 90°. By means of these oscillating gradient fields the projection on the $k_x$-$k_y$ plane forms a circle. The radius $k_p$, of the circle is determined by the amplitude of the $G_x$ and $G_y$ gradients, in the embodiment shown, the radius increases with increasing time t since the excitation RF-pulse 821. Additional gradients $842'_x$-$842'_y$, $843'_x$-$843'_y$, $844'_x$-$844'_y$, and $845'_x$-$845'_y$ are applied to start sampling at a desired position on the circle. The simultaneous application of these gradients creates a helical trajectory in three-dimensional k-space. This is illustrated in FIG. 9, in which a few trajectories 900 and 910, with starting points 901 and 911 and radius $k_p$ are indicated.

In this three-dimensional data acquisition method the volume is acquired cylinder by cylinder in k-space, each cylinder being sampled on a set of helical scanpaths. Preferably, the inner cylinders, i.e. acquired with a small amplitude of the $G_x$ and $G_y$ gradients and small $k_p$, are sampled following the early refocusing RF-pulses in the sequence and the outer cylinders with large $k_p$ later in the sequence, with larger values of time t. The radius $k_p$, increases monotonically but not linearly with the number of the refocusing RF-pulse, i.e. time t. This is advantageous if maximum use is to be made of the available gradient power, so that the frequency of the rotating gradient pair $G_x$, $G_y$ can be higher when its amplitude is lower. Accordingly, for the inner cylinders the angular velocity along the scanpath is higher, so a smaller number of scanpaths for coverage of a cylinder is sufficient. The outer cylinders need a larger number of scanpaths for a complete coverage.

Figure 10:
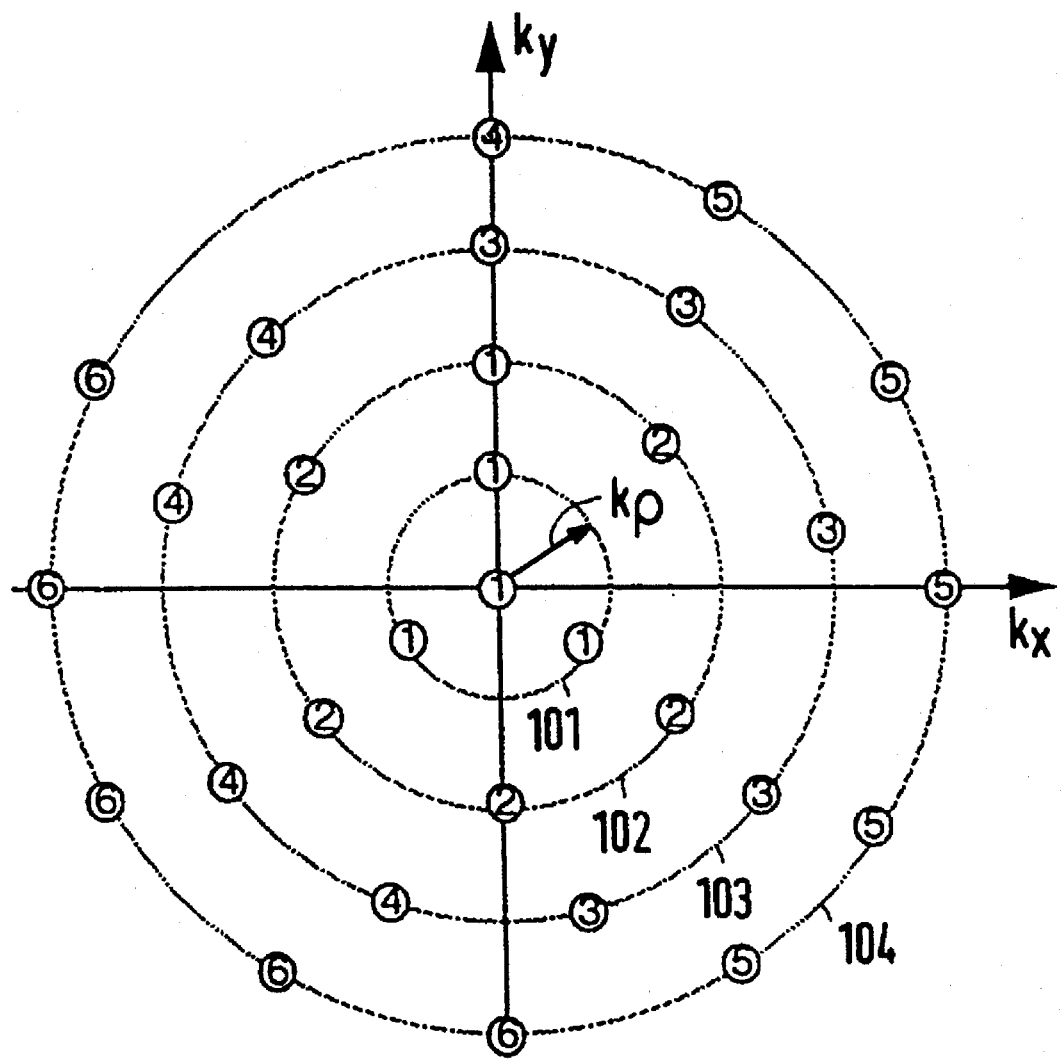
FIGS. 10 a possible distribution of starting points of trajectories.

In FIG. 10 an example is given of the distribution of scanpaths by indication the location of the starting point of each scanpath in the $k_x$-$k_y$ plane. Shown is a scheme for five sequences of starting with an excitation RF-pulse, each sequence comprising six refocusing RF-pulses. The helical scanpaths are located on four cylinders 101, 102, 103 and 104. The scanpath followed during data acquisition following the first refocusing RF-pulses are indicated by starting points labelled with "1". One of these scanpaths follows the $k_z$ axis, three are located on the innermost cylinder 101 and the fifth one on the second cylinder 102. The scanpaths following the second refocusing RF-pulse, having starting points labelled with "2", are all located on the second cylinder 102. The scanpaths followed after the third RF-pulse and after most of the fourth refocusing RF-pulses (starting points labelled "3" and "4") are located on the third cylinder 103, and the scanpaths followed after the last two refocusing RF-pulses ("5" and "6") are on the outermost cylinder 104. A number of the refocusing RF-pulse and radius $k_p$, is substantially monotonic but not linear.

A more linear progression of $k_p$ with the rank number of the refocusing RF-pulse may be advantageous as well. In such an approach the inner cylinders, representing the low spatial frequencies, are acquired significantly more often that the outer cylinders with high $k_p$. The inner cylinders contribute to a much higher temporal resolution of the coarse structures in the object. Such an approach, in which low spatial frequencies are scanned with high temporal resolution can be applied in studying the intake or washout of a contrast medium, e.g. in MR mammography. Such a technique, perse, is disclosed in EP-A 0 543 468.

The invented method of helical scans can be easily combined with a partial echo technique in the z-direction. The scan need not to be symmetrical around $k_z$=0, since the values on the "missing side" can be calculated by conjugate symmetry, as is often used with two- or three-dimensional MR acquisition techniques.

I claim:

1. A method for magnetic resonance imaging of a body placed in a stationary and substantially homogeneous main magnetic field, the method comprising, applying an excitation RF-pulse for excitation of nuclear dipole moments in at least a portion of the body, followed by applying a plurality of refocusing RF-pulses separated by intervals, switching, during said intervals, a plurality of gradient magnetic fields including reversal of gradient magnetic fields, for generating a plurality of magnetic resonance signals in the excited portion, measuring signal samples of said magnetic resonance signals, and transforming said signal samples into an image, wherein the gradient magnetic fields and RF-pulses are dimensioned and applied such that:

signal samples measured at substantially identical values of a first parameter, of which a first disturbing effect is a function, are located in k-space having substantially the same value in a first coordinate of k-space, signal samples measured at substantially identical values of a second parameter, of which a second disturbing effect is a function, are located in k-space having substantially the same value in a second coordinate of k-space, and signal samples measured at different values of said first and second parameters are located in k-space such that said parameters increase or decrease substantially monotonically with said first and second coordinates, respectively.

2. A method according to claim 1 wherein the first parameter corresponds to a time interval between the excitation RF-pulse and a moment at which a signal sample is measured and the second parameter corresponds to a time interval between the moment the sample is measured and a moment of occurrence of a refocusing spin echo.

3. A method according to claim 2, wherein signal samples measured at substantially identical values of a third parameter, of which a third disturbing effect is a function, are located in k-space having substantially the same value along a third coordinate of k-space and the third parameter is a phase error introduced by movement.

4. A method according to claim 3, wherein in between the refocusing RF-pulses a plurality of gradient field reversals is applied in a first direction for generating gradient echo signals substantially coinciding with a constant gradient field in a second direction, and phase encoding gradients are applied in said first direction in between the refocusing RF-pulses and said coinciding gradient field reversals and constant gradient fields, for phase encoding of the magnetic resonance signals monotonic increasing or decreasing with the time from the excitation RF-pulse.

5. A method according to claim 4, wherein a plurality of similar sequences, each comprising an excitation RF-pulse, a number of refocusing RF-pulses, gradient field reversals, and constant gradient fields, is applied, and wherein trajectories in k-space traversed during each sequence are displaced in a fixed direction by applying a suitable offset in time of the gradient fields, which offset changes between sequences.

6. A method according to claim 5, wherein in between the refocusing RF-pulses a plurality of gradient field reversals is applied in a first direction for generating gradient echo signals, gradient field blips substantially coinciding with reversal moments of the gradient field reversals are applied in a second direction, and phase encoding gradients are applied in said first direction in between the refocusing RF-pulses and said gradient field reversals, for phase encoding of the magnetic resonance signals, monotonic increasing or decreasing with the time from the excitation RF-pulse.

7. A method according to claim 6, wherein a plurality of similar sequences, each comprising an excitation RF-pulse, a number of refocusing RF-pulses, gradient field reversals, and gradient field blips, is applied, and wherein the trajectories in k-space traversed during each sequence are displaced in a fixed direction by applying a suitable offset in size of the gradient fields, which offset changes between sequences.

8. A method according to claim 2, wherein in between the refocusing RF-pulses a plurality of gradient field reversals is applied in a first direction for generating gradient echo signals, gradient field blips substantially coinciding with reversal moments of the gradient field reversals are applied in a second direction, and phase encoding gradients are applied in said first direction in between the refocusing RF-pulses and said gradient field reversals, for phase encoding of the magnetic resonance signals, monotonic increasing or decreasing with the time from the excitation RF-pulse.

9. A method according to claim 8, wherein a plurality of similar sequences, each comprising an excitation RF-pulse, a number of refocusing RF-pulses, gradient field reversals, and gradient field blips is applied, and wherein the trajectories in k-space traversed during each sequence are displaced in a fixed direction by applying a suitable offset in size of the gradient fields, which offset changes between sequences.

10. A method according to claim 2, wherein a plurality of similar sequences, each comprising an excitation RF-pulse, a number of refocusing RF-pulses, gradient field reversals, and constant gradient fields, is applied, and wherein trajectories in k-space traversed during each sequence are displaced in a fixed direction by applying a suitable offset in time of the gradient fields, which offset changes between sequences.

11. A method according to claim 2, wherein in between the refocusing RF-pulses a plurality of gradient field reversals is applied in a first direction for generating gradient echo signals substantially coinciding with a constant gradient field in a second direction, and phase encoding gradients are applied in said first direction in between the refocusing RF-pulses and said coinciding gradient field reversals and constant gradient fields, for phase encoding of the magnetic resonance signals monotonic increasing or decreasing with the time from the excitation RF-pulse.

12. A method according to claim 1, wherein signal samples measured at substantially identical values of a third parameter, of which a third disturbing effect is a function, are located in k-space having substantially the same value along a third coordinate of k-space and the third parameter is a phase error introduced by movement.

13. A method according to claim 3, wherein in between the refocusing RF-pulses a plurality of gradient field reversals is applied in a first direction for generating gradient echo signals substantially coinciding with a constant gradient field in a second direction, and phase encoding gradients are applied in said first direction in between the refocusing RF-pulses and said coinciding gradient field reversals and constant gradient fields, for phase encoding of the magnetic resonance signals monotonic increasing or decreasing with the time from the excitation RF-pulse.

14. A method according to claim 1, wherein in between the refocusing RF-pulses a plurality of gradient field reversals is applied in a first direction for generating gradient echo signals substantially coinciding with a constant gradient field in a second direction, and phase encoding gradients are applied in said first direction in between the refocusing RF-pulses and said coinciding gradient field reversals and constant gradient fields, for phase encoding of the magnetic resonance signals monotonic increasing or decreasing with the time from the excitation RF-pulse.

15. A method according to claim 14, wherein a plurality of similar sequences, each comprising an excitation RF-pulse, a number of refocusing RF-pulses, gradient field reversals, and constant gradient fields, is applied, and wherein trajectories in k-space traversed during each sequence are displaced in a fixed direction by applying a suitable offset in time of the gradient fields, which offset changes between sequences.

16. A method according to claim 1, wherein in between the refocusing RF-pulses a plurality of gradient field reversals is applied in a first direction for generating gradient echo signals, gradient field blips substantially coinciding with reversal moments of the gradient field reversals are applied in a second direction, and phase encoding gradients are applied in said first direction in between the refocusing RF-pulses and said gradient field reversals, for phase encoding of the magnetic resonance signals, monotonic increasing or decreasing with the time from the excitation RF-pulse.

17. A method according to claim 16, wherein a plurality of similar sequences, each comprising an excitation RF-pulse, a number of refocusing RF-pulses, gradient field reversals, and gradient field blips, is applied, and wherein the trajectories in k-space traversed during each sequence are displaced in a fixed direction by applying a suitable offset in size of the gradient fields, which offset changes between sequences.

18. A method according to claim 1, wherein the first coordinate in k-space is a distance to the origin in a plane perpendicular to an axis in k-space and that the second coordinate is said axis.

19. A method according to claim 18, wherein the first parameter corresponds to the time interval between the excitation RF-pulse and the moment at which a signal sample is measured, the second parameter corresponds to the time interval between the moment the sample is measured and the moment of occurrence of the refocusing spin echo, and gradient fields and RF-pulse are applied such that a non-linear monotonic increase of the first coordinate with the first parameter is obtained.

20. An apparatus for magnetic resonance imaging of a body placed in a stationary and substantially homogeneous main magnetic field, the apparatus comprising means for establishing the main magnetic field, means for generating gradient magnetic fields superimposed upon the main magnetic field, means for radiating RF-pulses towards the body, control means for steering the generation of the gradient magnetic fields and the RF-pulses, and means for receiving and sampling magnetic resonance signals generated by sequences of RF-pulses and switched gradient magnetic fields, said control means being arranged for:

applying an excitation RF-pulse for excitation of nuclear dipole moments in at least a portion of the body, followed by applying a plurality of refocusing RF-pulses separated by intervals, switching, during said intervals, a plurality of gradient magnetic fields including reversal of gradient magnetic fields, for generating a plurality of magnetic resonance signals in the excited portion, measuring signal samples of said magnetic resonance signals, and transforming said signal samples into an image, wherein the control means is further arranged for dimensioning and applying the gradient magnetic fields and RF-pulses such that:

signal samples measured at substantially identical values of a first parameter, of which a first disturbing effect is a function, are located in k-space having substantially the same value along a first coordinate of k-space, signal samples measured at substantially identical values of a second parameter, of which a second disturbing effect is a function, are located in k-space having substantially the same value along a second coordinate of k-space, and signal samples measured at different values of said first and second parameters are located in k-space such that said parameters increase or decrease substantially monotonically in the direction of said first and second coordinates, respectively.

* * * * *